United States Patent
Findlater et al.

(10) Patent No.: US 8,483,291 B2
(45) Date of Patent: Jul. 9, 2013

(54) ANALOG TO DIGITAL CONVERTER WITH INCREASED SUB-RANGE RESOLUTION

(75) Inventors: Keith Findlater, Edinburgh (GB); Seyed A A Danesh, Edinburgh (GB); Jonathan Ephraim David Hurwitz, Edinburgh (GB)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 13/246,308

(22) Filed: Sep. 27, 2011

(65) Prior Publication Data

US 2013/0003873 A1 Jan. 3, 2013

Related U.S. Application Data

(60) Provisional application No. 61/503,060, filed on Jun. 30, 2011.

(51) Int. Cl.
*H04B 3/00* (2006.01)

(52) U.S. Cl.
USPC ........... 375/257; 375/295; 375/243; 375/245; 375/346; 375/349; 341/129; 341/131; 341/155; 341/200; 341/156; 341/168

(58) Field of Classification Search
USPC .. 341/129, 131, 155, 200, 156, 168; 375/243, 375/245, 346, 349, 257, 295
See application file for complete search history.

(56) References Cited

U.S. PATENT DOCUMENTS

| | | | |
|---|---|---|---|
| 5,250,948 A * | 10/1993 | Berstein et al. | 341/131 |
| 6,285,309 B1 * | 9/2001 | Yu | 341/161 |
| 2007/0024484 A1 * | 2/2007 | Liu | 341/156 |
| 2010/0066583 A1 * | 3/2010 | Jeon et al. | 341/161 |

* cited by examiner

*Primary Examiner* — Daniel Washburn
*Assistant Examiner* — Rahel Guarino
(74) *Attorney, Agent, or Firm* — Garlick & Markison; Bruce E. Garlick

(57) ABSTRACT

An analog to digital converter with increased sub-range resolution and method for using the analog to digital converter is described herein. The device includes an analog front end that produces an analog communication signal, a digital front end that receives a digital communication signal, and an Analog to Digital Converter (ADC) that samples the analog communication signal across a full-range. The ADC includes a plurality of sub-range ADCs, each sub-range ADC measuring the analog communication signal across at least one respective sub-range of the full-range, the plurality of sub-ranges extending across the full-range, a central sub-range ADC having greater quantization accuracy than at least one other sub-range ADC. The ADC also includes signal combining circuitry operable to process outputs of the plurality of sub-range ADCs to create the digital communication signal.

23 Claims, 12 Drawing Sheets

ANALOG TO DIGITAL CONVERTER WITH INCREASED SUB-RANGE RESOLUTION

CROSS-REFERENCE TO PRIORITY APPLICATION

This application claims priority under 35 U.S.C. §119(e) to U.S. Provisional Application Ser. No. 61/503,060 filed Jun. 30, 2011, which is incorporated herein by reference in its entirety.

BACKGROUND OF THE INVENTION

1. Field of the Invention

The present invention relates to communication devices and in particular, analog to digital converters used in communication devices.

2. Description of the Related Art

Communication systems are known to support wireless and wire lined communications between wireless and/or wire lined communication devices. Communication systems range from national and/or international cellular telephone systems to the Internet to point-to-point in-home wireless networks. Each type of communication system is constructed, and hence operates, in accordance with one or more communication standards. Wireless communication systems include Wireless Local Area Networks, Wireless Personal Area Networks, cellular communication systems, satellite communication systems, 60 GHz standards, Near Field Communications, and Infrared Communications, among others. Wired communication systems include Wide Area Networks, Local Area Networks, the Internet, and the World Wide Web, among others.

Powerline communication (PLC) is a technology that encodes data in a signal and transmits the signal on existing electricity powerlines in a band of frequencies that are not used for supplying electricity. Accordingly, PLC leverages the ubiquity of existing electricity networks to provide extensive network coverage. Furthermore, since PLC enables data to be accessed from conventional power-outlets, no new wiring needs to be installed in a building (or different parts of a building). Accordingly, PLC offers the additional advantage of reduced installation costs. Communications within the household or within other premises may also be serviced other communication techniques as well.

All communication devices include similar components, including an Analog Front End (AFE) and a Digital Front End (DFE). The AFE processes analog communication signals and couples the analog communication signals to and from an antenna, media, etc. The DFE processes digital communication signals and interfaces with host processing circuitry. Analog to Digital Converters (ADCs) and Digital to Analog Converters (DACs) inter couple the DFE and the AFE and convert the communication signals between an analog format and a digital format.

Modern communication devices place great demands on the ADCs and DACs. In particular, ADCs are required to sample analog communication signals across wide frequency bands to produce corresponding digital communication signals. This is increasingly difficult to achieve with a single ADC, so to address this problem, one solution is to combine the use of multiple individual ADCs that sample the analog communication signals in a time divided manner and then combine the multiple digitized signals produced by the multiple individual ADCs. Time synchronization of the multiple individual ADCs is highly susceptible to timing and phase errors, which grows more problematic with wider frequency band servicing. In wide-band environments such as in PLC communications, timing and phase error correction circuits that are required for correcting the timing and phase errors occupy about the same area as that of the core ADC elements. The timing and phase error correction circuits produce heat, consume power, and increase the size of the Integrated Circuit in which they reside. Further, while this time divided ADC structure may provide benefits in some communication devices, e.g., Coaxial tuners, it is less beneficial for other communication devices, e.g., PLC devices.

DETAILED DESCRIPTION

Figure 1:
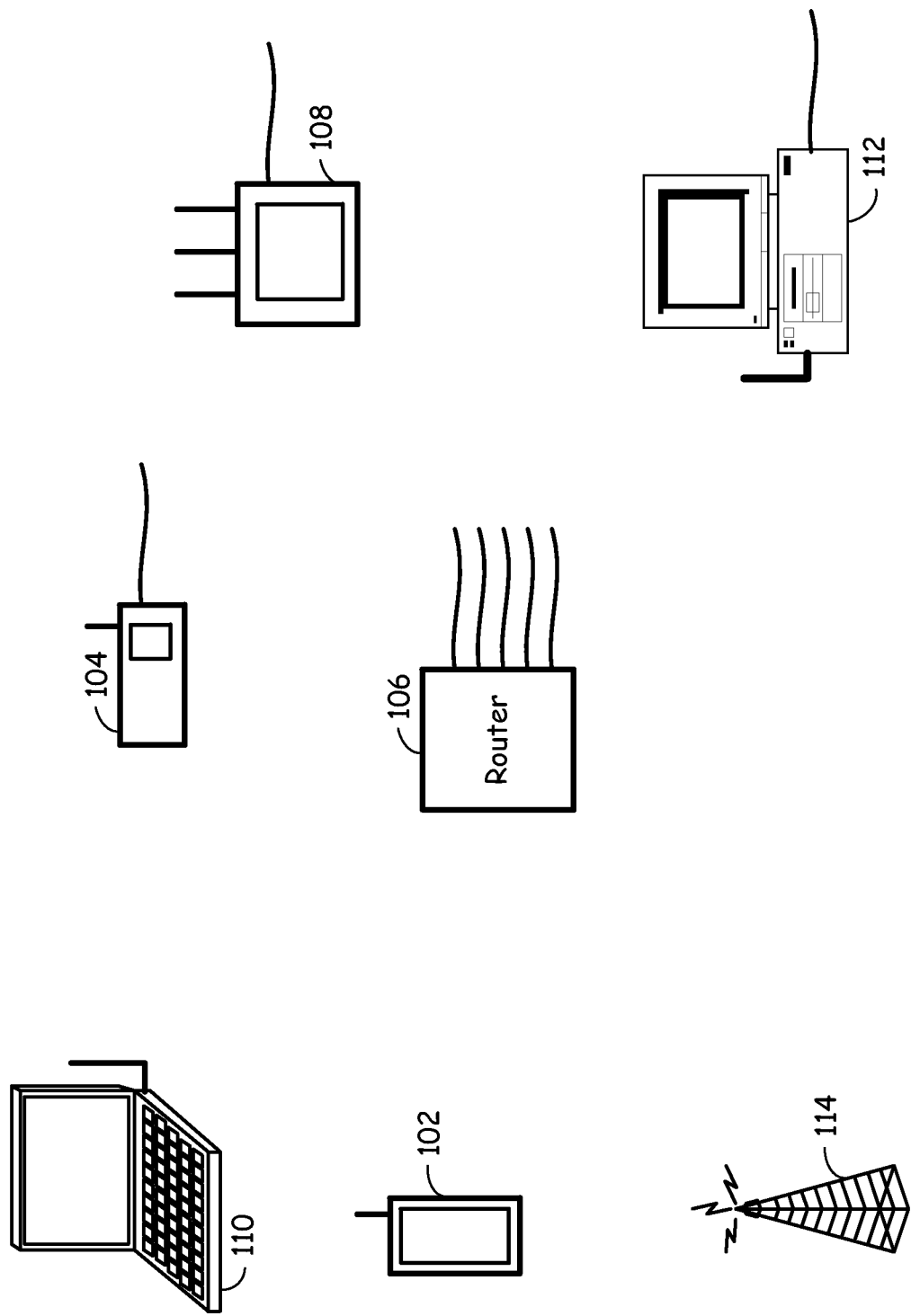
FIG. 1 is a system diagram illustrating various communication devices that include therein an Analog to Digital Converter (ADC) constructed and operating according to one or more embodiments of the present invention.

FIG. 1 is a system diagram illustrating various communication devices that include therein an Analog to Digital Converter (ADC) constructed and operating according to one or more embodiments of the present invention. The communication devices of FIG. 1 include an ADC that operates upon one or more communication signals. The ADC of the present invention may also operate upon signals other than communication signals. The communication devices illustrated in FIG. 1 include a handheld communication device 102, a wireless router 104, a wired router 106, a set top box/video player/audio-video device 108, laptop computer 110, desktop computer 112, or a base station 114. Other devices than those shown may also include an ADC constructed and operating according to the present invention.

The handheld device 102 may be a cellular telephone that communicates with a cellular network via one or more radio interfaces, a Personal Data Assistant, a handheld data terminal, or another hand held device. The handheld device 102 may also service Wireless Local Area Network (WLAN) communications, Wireless Personal Area Network (WPAN) communications, Global Positioning System (GPS) operations, 60 GHz operations, infrared operations, and/or other communications operations. The wireless router 104 includes both a wireless interface and a wired interface. The wireless router 104 communicates wirelessly with a number of serviced client devices and may communicate with a remote device via a wired link. The wired link may be a cable modem communication link, an optical communication link, a Local Area Network (LAN) communication link or another communication link. The router 106 routes communication signals via its ports among a plurality of remote devices. The set top box 108 services home entertainment, streaming media, and/other communications within a home or premises. The set top box 108 may stream content to televisions, multimedia systems, and/or other audio video devices.

The laptop computer 110 may include a cellular, WLAN, or WPAN communication link that services communications between the laptop computer 110 and one or more remote devices. The desktop computer 112 may include a wired communication link and/or one more wireless communication links that service communications of the desktop computer 112. Base station 114 services a plurality of wirelessly coupled cellular telephones or Wireless Wide Area Network (WWAN) terminals within its service coverage area.

Each of the devices 102-114 illustrated in FIG. 1 includes an ADC constructed and operated according to one or more embodiments of the present invention. As will be further described herein with reference to subsequent FIGs., the ADC is operable to receive analog communication signals and to convert the analog communication signals to digital communication signals. In other of its implementations, the ADC of the present invention is operable to receive non-communication analog signals and to convert the analog signals to digital signals.

Figure 2:
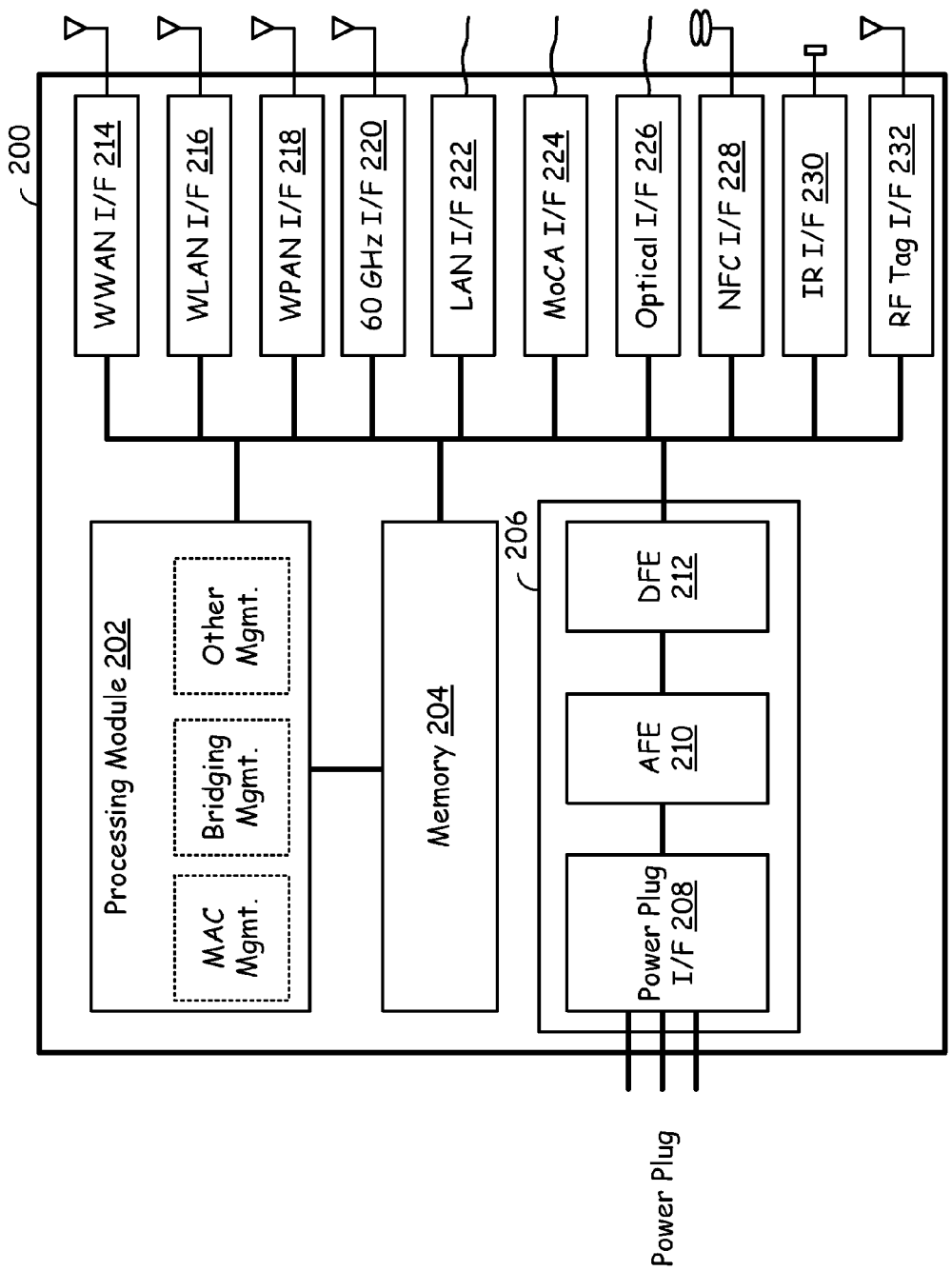
FIG. 2 is a block diagram illustrating a Powerline Communication (PLC) device constructed according to one or more embodiments of the present invention.

FIG. 2 is a block diagram illustrating a Powerline Communication (PLC) device constructed according to one or more other embodiments of the present invention. The PLC device 200 supports PLC operations according to one or more PLC communication standards. In some embodiments, the PLC device 200 may be permanently installed within a home or other premises. In other embodiments, the PLC device is mobile and services powerline communications when plugged into a wall plug and when one or more devices is available for paired communication via the wall plug.

The PLC device 200 includes a PLC interface 206 that includes a power plug interface 208, an Analog Front End (AFE) 210, and a Digital Front End (DFE) 212. Generally the AFE 210 includes analog signal processing elements while the DFE 212 includes digital signal processing elements. At least one Analog to Digital Converter (ADC) and at least one Digital to Analog Converter (DAC) service analog to digital and digital to analog signal conversion operations, respectively. The ADC of the PLC interface 206 is constructed and operates according to one or more embodiments of the present invention.

The PLC device 200 also includes one or more other communication interfaces, including a WWAN interface 214, e.g., a WiMAX interface, a WLAN interface 216, e.g., an 802.11x interface, a WPAN interface 218, e.g., a Bluetooth interface, a 60 GHz interface 220 (millimeter wave interface), a LAN interface 222, e.g., an Ethernet interface, a cable interface 224, e.g. Multimedia over Coax Alliance (MoCA) interface 224, an optical interface 226, a Near Field Communication (NFC) I/F 228, an Infra-Red I/F 230, and/or an RF Tag I/F 232. The user should appreciate that the PLC device 200 may bridge communications between a power plug and one or more devices, e.g., between the power plug and a desktop computer, a laptop computer, a touchpad computer, an appliance, a television, another entertainment system device, etc., via the PLC interface 206 and one or more of the other communication interfaces 214, 216, 218, 220, 222, 224, 226, 228, 230, and/or 232.

The processing module 202 may include one or more of a system processor, a digital signal processor, a processing module, dedicated hardware, an application specific integrated circuit (ASIC), or other circuitry that is capable of executing software instructions and for processing data. In particular, the processing module 202 is operable to support Medium Access Control (MAC) management, communications bridging management, and other management of the communications circuitry of the PLC device 200. The memory 204 may be RAM, ROM, FLASH RAM, FLASH ROM, optical memory, magnetic memory, or other types of memory that is capable of storing data and/or instructions in allowing processing circuitry to access same.

Each of the communication interfaces of the PLC device 200 of FIG. 2 may include an ADC constructed and operating according to one or more embodiments of the present invention. In particular, the AFE 210 or DFE 212 of the PLC interface 206 of the PLC communication device 200 will include an ADC that converts communication signals between an analog format and a digital format. Likewise, each of the other communication interfaces 214-232 may also include an ADC constructed and operating according to one or more embodiments of the present invention. The manner in which the ADC of the present invention operates upon communication signals will be described further herein with reference to the subsequent FIGs.

Figure 3:
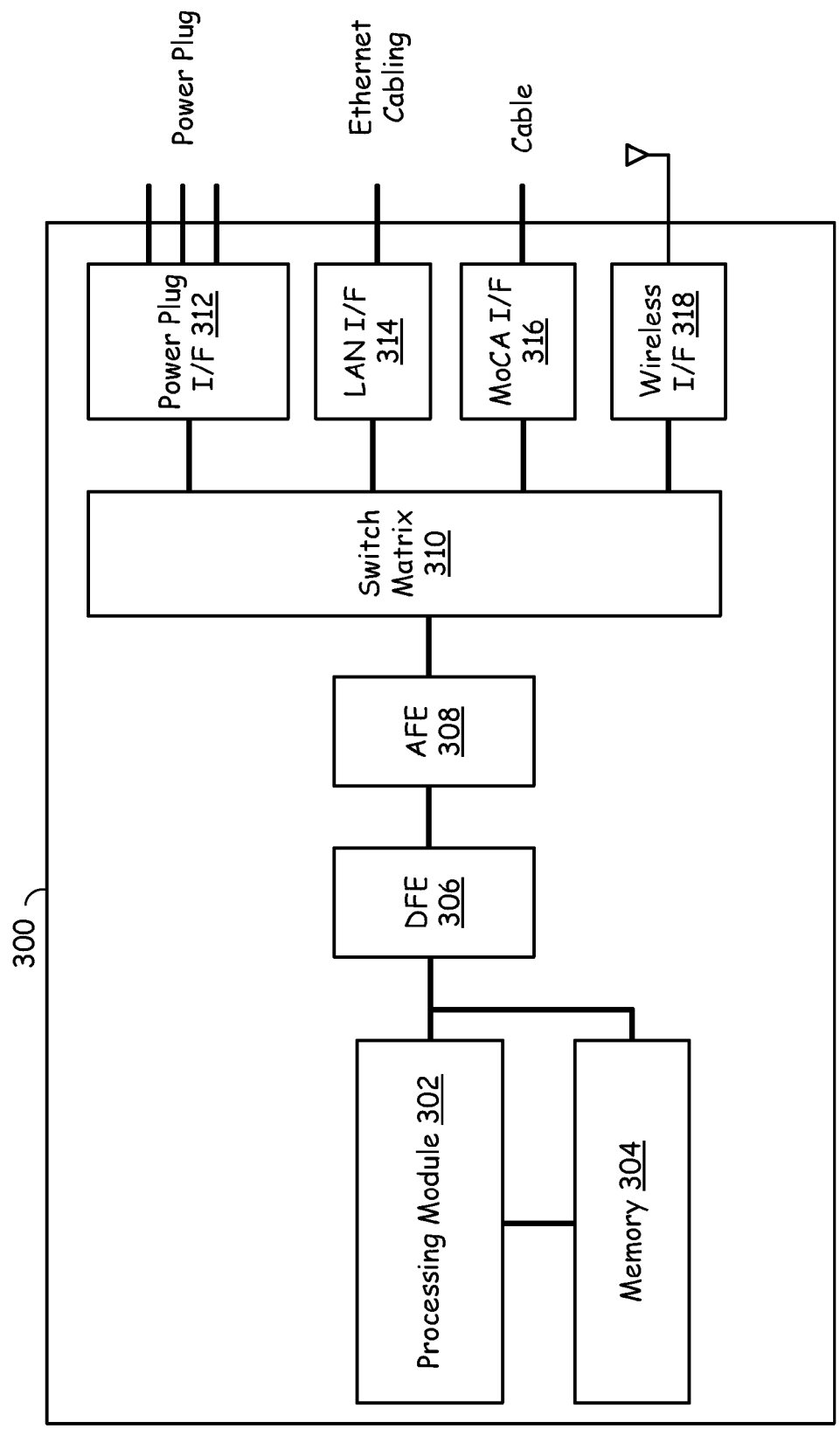
FIG. 3 illustrates a communication device having a configurable architecture and that includes at least one ADC constructed and operating according to one or more embodiments of the present invention.

FIG. 3 illustrates a communication device having a configurable architecture and that includes at least one ADC constructed and operating according to one or more embodiments of the present invention. The PLC device 300 includes a processing module 302 and memory 304 that may have a structure similar or same as like named components of FIG. 2. The PLC device 300 further includes a DFE 306 and an AFE 308 that may have a structure similar or same as like named components of FIG. 2. The PLC device 300 further includes a switch matrix 310 that intercouples the AFE 308 to a PLC I/F 312, a LAN I/F 314, a MoCA I/F 316, and a Wireless I/F 318.

The PLC device 300 or communication device 300 of FIG. 3 includes one or more ADCs constructed and operating according to the present invention to convert an analog signal to a digital signal. With the particular structure of FIG. 3, the ADC would be present in either the DFE 306 or AFE 308 to link the two components together via analog to digital signal conversion. In such case, the ADC of the present invention would service communication signals received by each of the particular media coupled to the PLC device 300. For example, when the PLC device 300 services PLC communications, an analog communication signal coupled to the powerline media at power plug is received via the power plug interface 312 and relayed to AFE 308 via switch matrix 310.

After processing of the analog communication signal by AFE 308, the ADC of the present invention would convert the analog communication signal to a digital communication signal. Likewise, an analog communication signal could be linked by LAN interface 314 from Ethernet cabling via switch matrix 310 to AFE 308. This communication signal that is an Ethernet type signal would be processed by AFE 308 and converted to a digital communication signal by the ADC operating according to present invention. Moreover, communication signals received via MoCA interface 316 or wireless interface 318 may be coupled by switch matrix 310 to AFE 308 for further processing and then subsequent conversion by a DFE constructed and operating according to the present invention to convert the analog communication signal to a digital communication signal.

Figure 4:
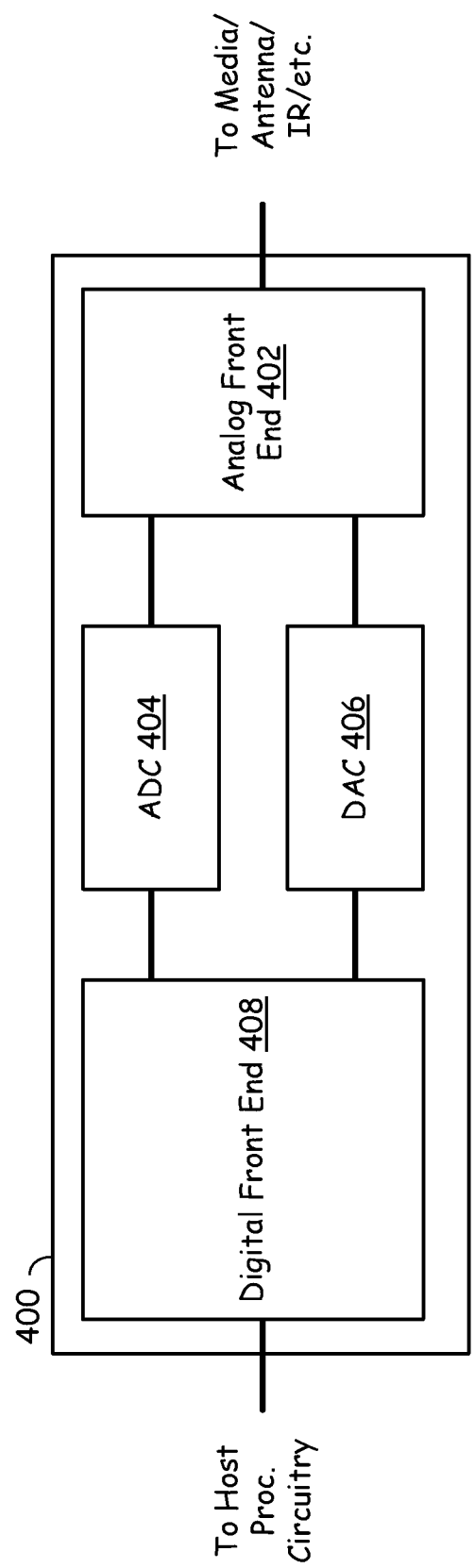
FIG. 4 is a block diagram illustrating a communication interface having an ADC constructed and operating according to one or more embodiments of the present invention.

FIG. 4 is a block diagram illustrating a communication interface having an ADC constructed and operating according to one or more embodiments of the present invention. The communication interface 400 is generically shown to include an analog front end 402 that receives analog signals from and transmits analog communication signals to a media/antenna/infrared interface, or another coupling element. The analog front end 402 processes incoming analog communication signals and also processes outgoing analog communication signals prior to coupling the outgoing analog communication signals to the media. The digital front end 408 processes digital communication signals both incoming and outgoing. The DFE 408 couples to host processing circuitry and services the communications needs of the host processing circuitry. A digital to analog converter (DAC) 406 receives outgoing digital signals from the DFE 408, converts the outgoing digital signals to outgoing analog signals, and couples the outgoing analog signals to the AFE 402. ADC 404 receives analog communication signals from the AFE 402 and converts the analog communication signals to digital communication signals and couples the digital communication signals to the DFE 408. The ADC 404 of the communications interface 400 of FIG. 4 is constructed and operates according to one or more embodiments of the present invention as will be more fully described herein with reference to FIG. 5 through FIG. 9.

Figure 5:
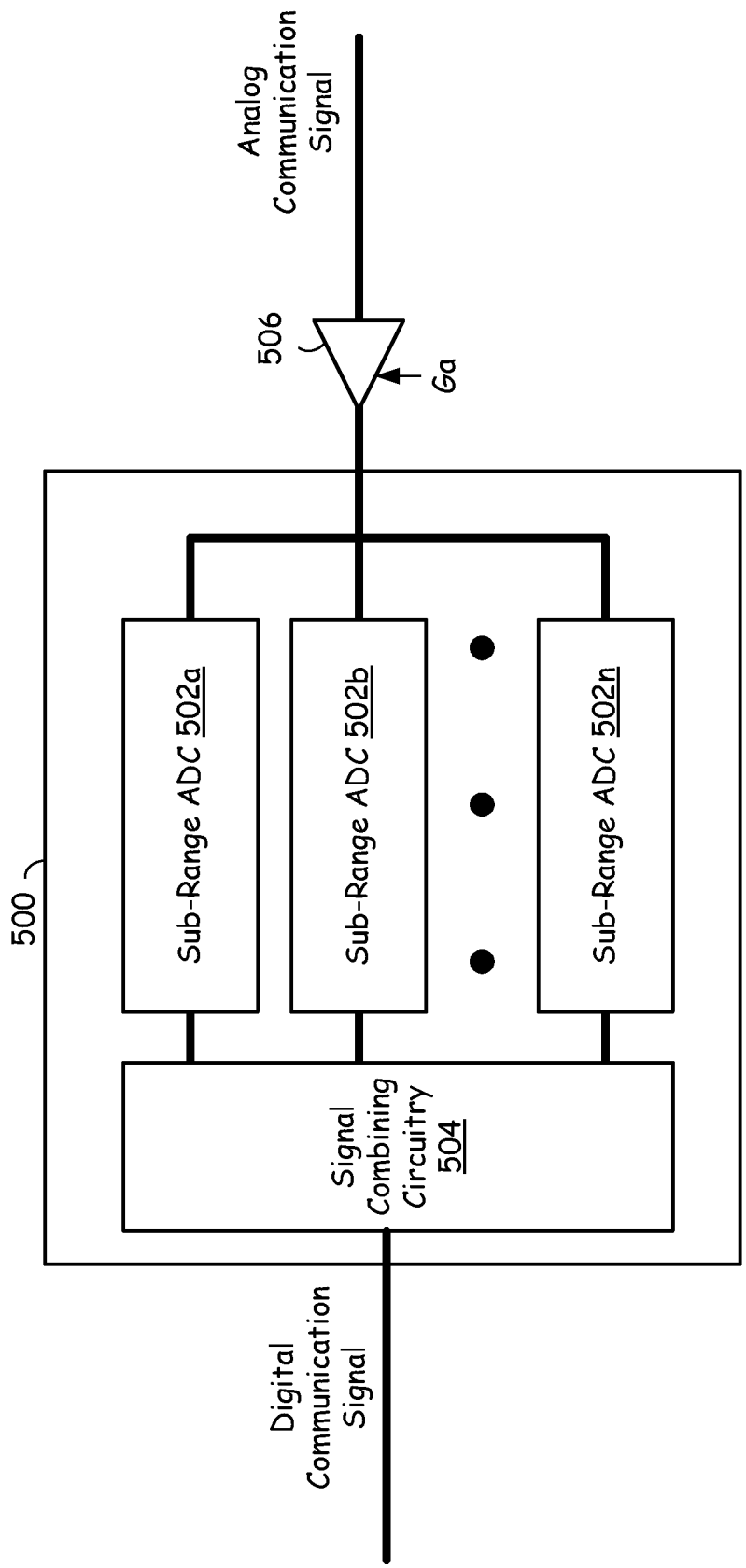
FIG. 5 is a block diagram illustrating an ADC constructed and operated according to one or more embodiments of the present invention.

FIG. 5 is a block diagram illustrating an ADC constructed and operated according to one or more embodiments of the present invention. The ADC 500 includes a plurality of sub-range ADCs 502a, 502b, and 502n. Each of the sub-range ADCs 502a, 502b, and 502n measures an analog communication signal across at least one respective sub-range of a full range serviced by the ADC 500. The plurality of sub-ranges extend across the full range with a central sub-range ADC, e.g. ADC 502b, having a smaller quantization step size and, resultantly, greater quantization accuracy than at least one other sub-range ADC, e.g. sub-range ADC 502a and sub-range ADC 502n. The ADC 500 further includes signal combining circuitry 504 that is operable to process outputs of the plurality of sub-range ADCs 502a, 502b, and 502n to create a digital communication signal.

The ADC 500 of FIG. 5 may be included with a communication device that also has a processing module, memory, and a communication interface. The ADC 500 of FIG. 5 links an AFE and a DFE of the communication device. As was previously described, the AFE produces an analog communication signal to the ADC and the DFE receives the digital communication signal from the ADC. In a typical installation, the AFE couples to an antenna, a physical media, or to another interface and processes an incoming signal to produce the analog communication signal. The DFE further processes the digital communication signal received from the ADC 500 and produces data therefrom and couples such data for output. Not shown in FIG. 5 are the DAC, or other components of a communication interface according to various aspects of prior art.

A central sub-range of the ADC 500 of FIG. 5 may correspond to an expected range of the analog communication signal. For example, the central sub-range may correspond to approximately a middle quarter of the full range. In such case, a first sub-range may extend from an upper portion of the central sub-range to an upper portion of the full range and a second sub-range extends from a lower portion of the central sub-range to a lower portion of the full range.

According to an aspect of the present invention, the AFE that includes the ADC 500 may include a programmable gain amplifier (PGA) 506 that is responsive to a gain input and operable to gain adjust the analog communication signal. Gain control circuitry is operable to produce the gain input to the PGA 506 so that the analog communication signal will fall within the expected range.

According to another aspect of the present invention, the central sub-range ADC 502b has greater quantization accuracy by virtue of having a smaller quantization step size than at least one other sub-range ADC, 502a, or 502n. There are different constructs/operations according to the present invention that cause the central sub-range ADC 502b to have a greater quantization accuracy than at least one other sub-range ADC 502a or 502n. According to a first aspect of the present invention, central sub-range ADC 502b has at least one more bit of resolution than sub-range ADCs 502a and 502n. In such construct, even though outer sub-ranges are approximately of the same widths as the central sub-range, the central sub range ADC 502b has a smaller quantization step size and a greater quantization accuracy than the outer sub-range ADCs 502a and 502n.

According to another aspect of the present invention, the central sub-range is narrower than the total range covered by the outer sub-range(s). In such case, the central sub-range ADC has the same bit resolution as does the sub-range ADC(s) corresponding to the outer sub-range(s). However, because of its narrower respective sub-range, the central sub-range ADC 502b has a smaller quantization step size and a greater quantization accuracy than the sub-range ADCs 502a and 502n covering the outer sub-ranges because its central sub-range is narrower than the outer sub-ranges. The ADC 500 of FIG. 5 may be implemented to perform sampling consistently with either FIG. 6A or FIG. 6B.

Figure 6A:
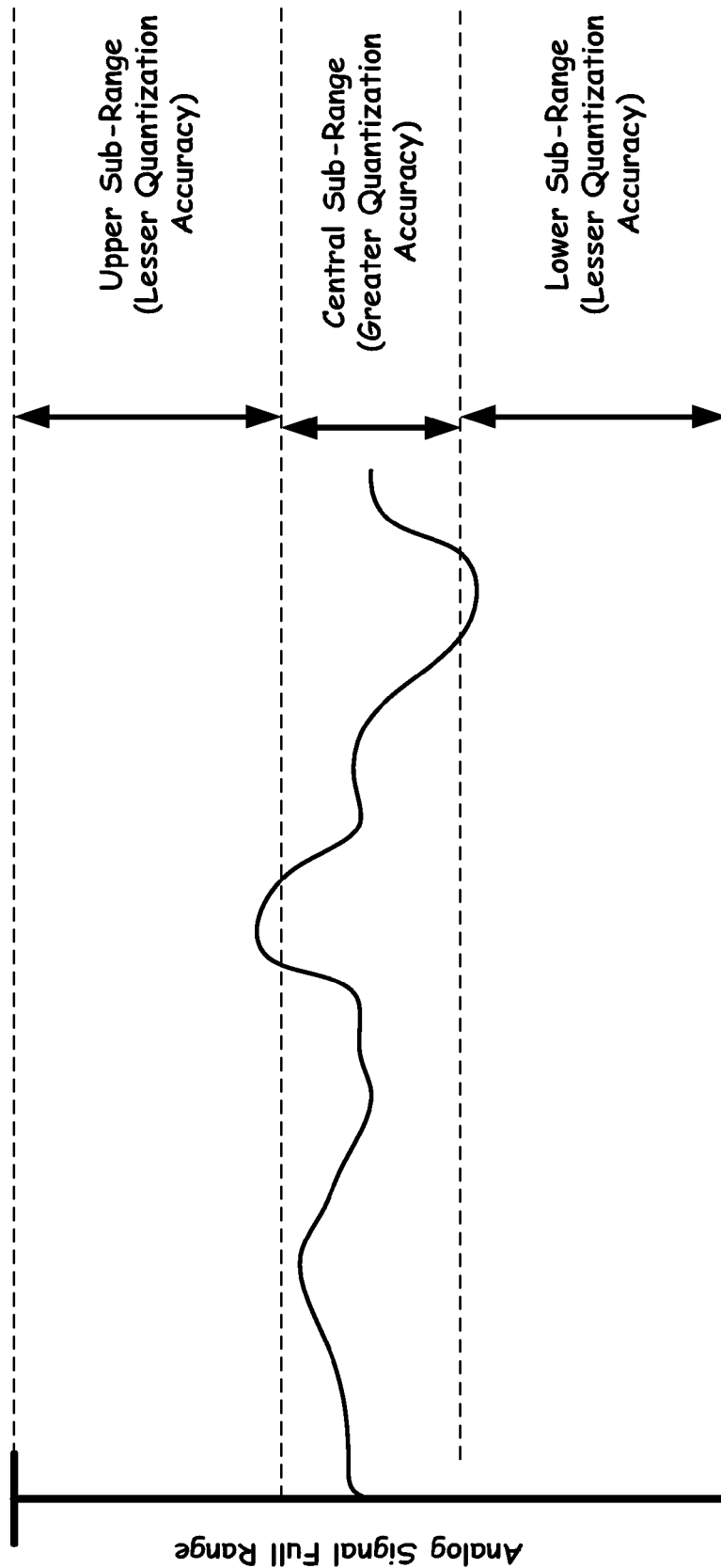
FIG. 6A is a graph illustrating a full range of an analog communication signal operated on by an ADC constructed according to the present invention.

FIG. 6A is a graph illustrating a full range of an analog communication signal operated on by an ADC constructed according to the present invention. As is shown, the analog communication signal primarily resides within a central sub-range serviced by a central sub-range ADC that has greater quantization accuracy (smaller quantization step sizes) than the upper sub-range lower sub-range ADCs that service corresponding upper and lower sub-ranges. In such case, with an analog communication signal primarily residing within the central sub-range during most operations, the discernibility inaccuracy of measuring the analog communication signal is greater. By stitching (combining) the outputs of the plurality of sub-range ADCs together, a digital communication signal is output from an ADC of the present invention with full range but will have greater resolution and resultantly a greater bandwidth of digital communication signal that provides higher performance for subsequent processing.

In an implementation of an ADC constructed according to the present invention, a wide band communication signal is sampled by the ADC. It is important to have a wide bandwidth representation of this analog communication signal so as to not lose information, e.g. due to higher order modulations employed and a great number of tones in an OFDM front end, for example. Thus, with the ADC of the present invention, the greater bit density of the central sub-range allows the ADC of the present invention to have a wide bandwidth and still a full range representation of the digital communication signal without the timing errors that are prevalent in prior art ADCs. One significant advantage of the invention over prior art is that any error alignment of timing and phase, offset or gain errors made for the 'outer' ADC with respect to the 'inner' ADC only needs to affect statistically the lower probability of occurrence of the signal in the outer range, thus reducing the specification requirement of alignment.

Figure 6B:
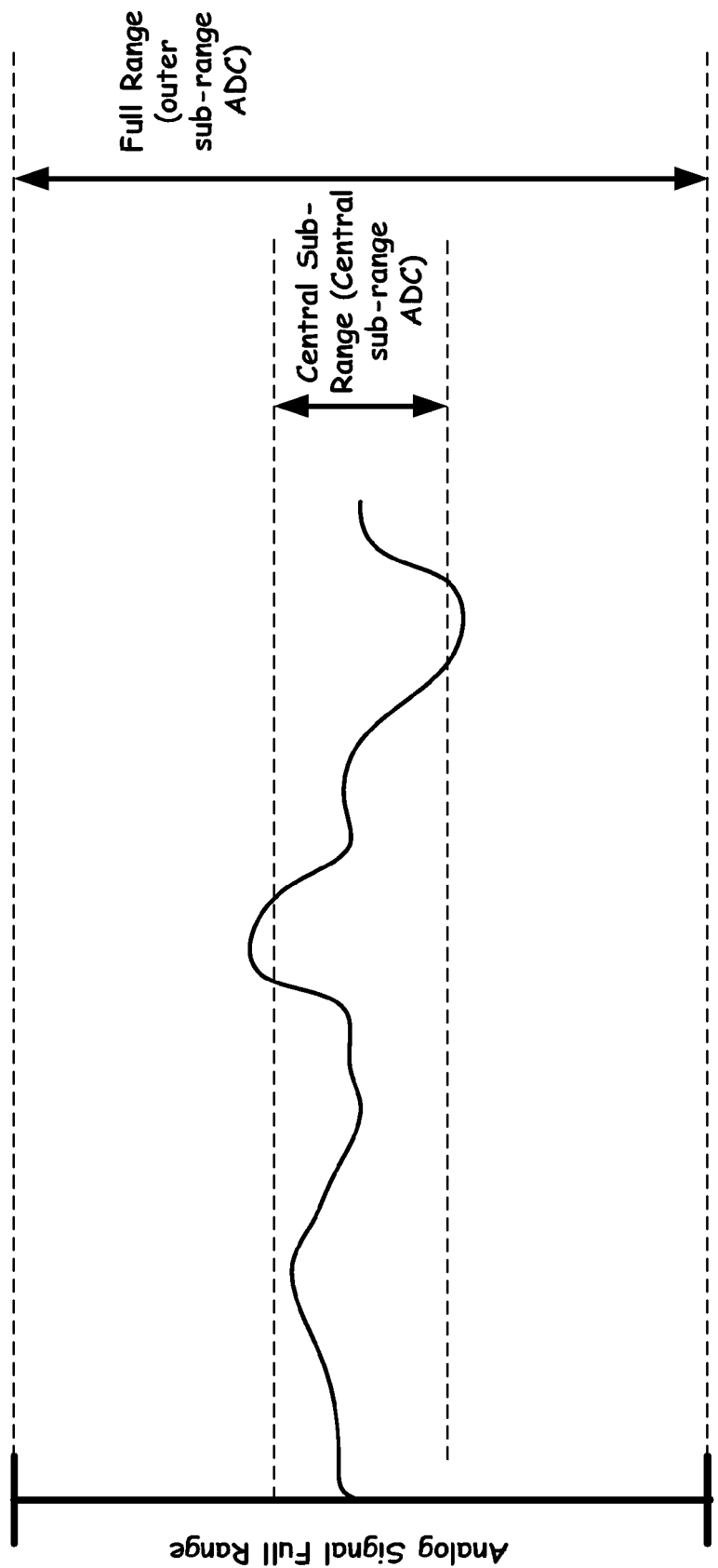
FIG. 6B is a graph illustrating a full range of an analog communication signal operated on by an ADC constructed according to the present invention but with differing sub-range ADC span than that of FIG. 6A.

FIG. 6B is a graph illustrating a full range of an analog communication signal operated on by an ADC constructed according to the present invention. As was the case with FIG. 6A, the analog communication signal primarily resides within a central sub-range serviced by a central sub-range ADC. However, with the example of FIG. 6B, a single sub-range ADC samples across all of the full range and its output is used when the signal does not reside within the central sub-range ADC.

With the example of FIG. 6B, an ADC according to the present invention includes two sub-range ADCs. A central sub-range ADC spans the central ¼ of the full range and the other sub-range ADC covers the full range (two sub-ranges that do not correspond to the central sub-range). Referring to both FIGS. 5 and 6B, ADCs 502a (full range) and 502b (central sub-range) may be 6-bit converters (with 64 unique quantization levels) with the central-range ADC 502b corresponding to ¼ of the full range and ADC 502a corresponding to the full range. Since the central sub-range ADC 502b covers ¼ of the range that ADC 502a covers, its step size and quantization accuracy is effectively 4 times greater than that of ADC 502b. Effectively the ADC 500 output (digital communication signal) is an 8-bit digital signal for the central range while only being a 6-bit digital signal outside of the central range. Such is the case because the two most significant bits of an 8 bit output for the central range are known and constant. With this example, the ADC 500 output is, effectively, the output of the ADC 502b when the communication signal resides within the central sub-range and is the output of the ADC 502a when the communication signal resides outside of the central sub-range.

Advantageously, with either the embodiment of FIG. 6A or 6B, an ADC constructed and operating according to the present invention is more resistant to impulse noise, which is present in PLC systems, for example. In PLC systems, noise events within a band of communication suddenly appear and can have power levels much larger than the communication signal(s) of interest. In prior devices, such noise events caused the prior art ADCs to saturate and clip, with the digital communication signal (ADC output) also clipped, resulting in a significant loss of signal. With the ADC of the present invention, the impulse noise event causes the analog communication signal to be in one or more of the outer sub-ranges of the full range (corresponding to sub-range ADC with lower resolution) but not to clip the output of the ADC (composite of sub-range ADCs), meaning the outcome of the impulse noise event is a slight momentary loss of accuracy and but not clipped, which is a much preferable operating condition. Because of this benefit of the ADC of the present invention, the PGA may be calibrated for normal operation without clipping caused by the impulse noise event, resulting implementing resistance to impulse noise events.

Figure 7:
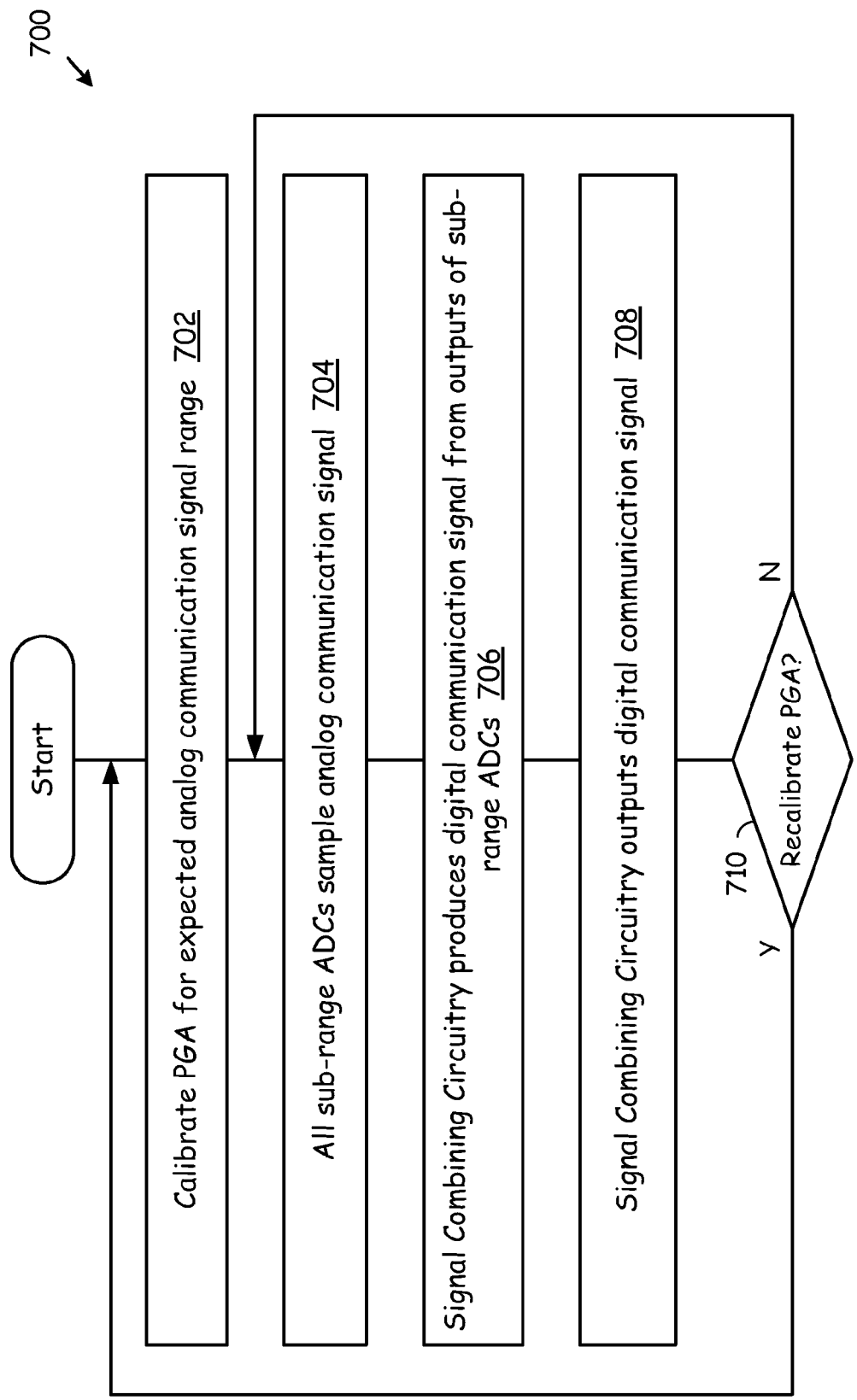
FIG. 7 is a flowchart illustrating operations of an ADC constructed and operating according to one or more embodiments of the present invention.

FIG. 7 is a flowchart illustrating operations 700 of an ADC constructed and operating according to one or more embodiments of the present invention. Operations 700 commence with calibrating a programmable gain amplifier (PGA) for expected analog communication signal range (Step 702). As was previously described with reference to FIG. 5, a PGA 506 is to be calibrated so that saturation will not occur across the full range of the ADC and so that the communication signal primarily resides within the central sub-range. Thus, DC offset may also be included in the calibration of the PGA as well as gain at Step 702. In such case, the gain of the PGA and DC offset may be two separate settings for the PGA to ensure that the ADC operates as efficiently as possible to produce as accurate of a representation of the analog communication signal within the digital communication signal as possible.

Then, operation 700 continues with the sub-range ADCs sampling the analog communication signal (Step 704). As was previously described, the ADC samples the communication signal using a plurality of sub-range ADCs with each sub-range ADC measuring the analog communication signal across a respective sub-range of the full range. The plurality of sub-ranges extends across the full range with a central sub-range ADC having greater quantization accuracy (smaller quantization step size) than at least one other sub-range ADC. Thus, Step 706 produces a plurality of ADC outputs from the plurality of sub-range ADCs. Operation proceeds at Step 708 where signal combining circuitry produces the digital communication signal from the plurality of outputs of the plurality of sub-range ADCs. The operations of Step 708 may include stitching the ADC outputs together such that a continuous representation across the full range of the communication signal is represented. Then, it is determined whether to recalibrate the PGA (Step 710). If recalibration of the PGA is required, operation proceeds to Step 702. If recalibration of the PGA is not required, operation returns to Step 704.

Figure 8:
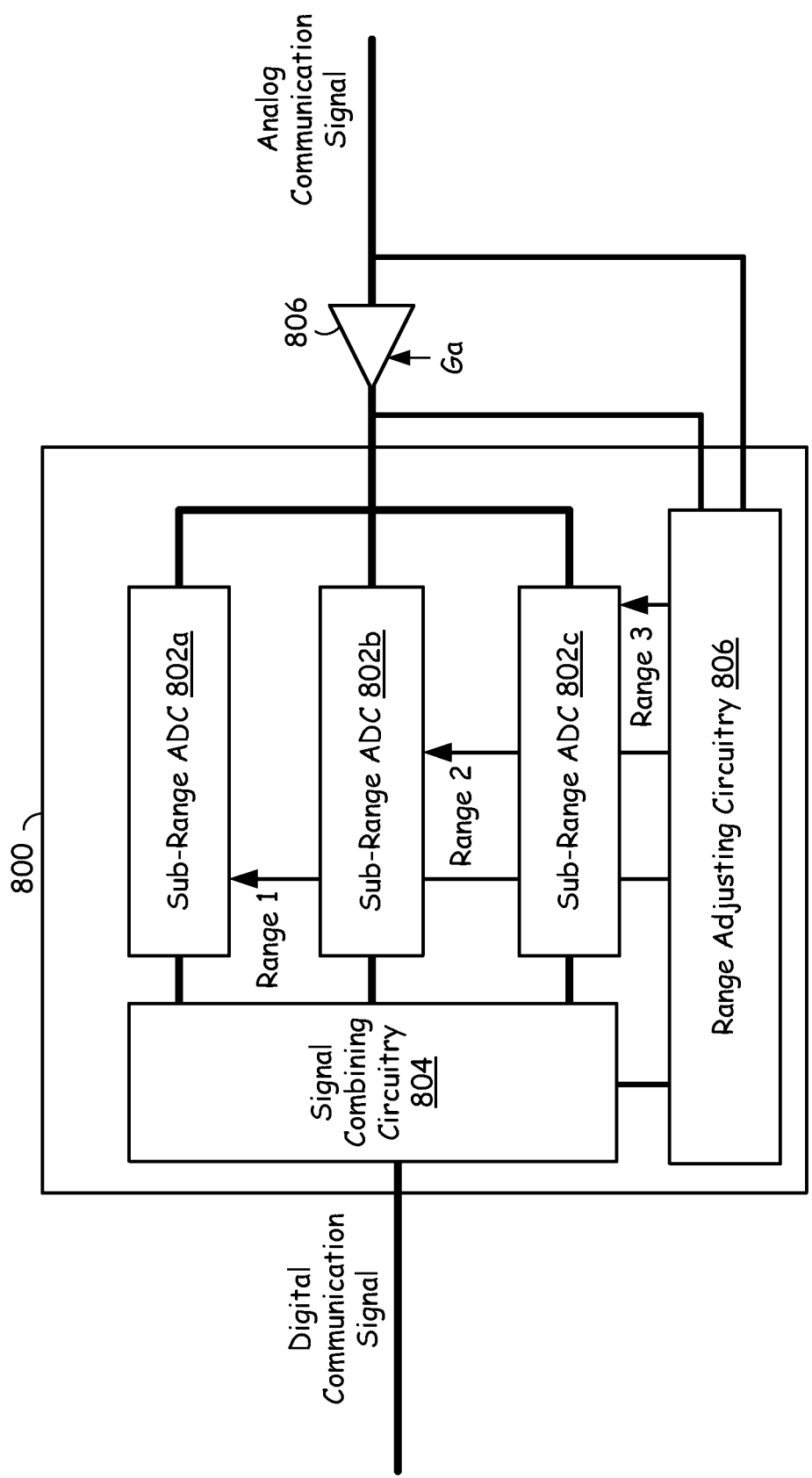
FIG. 8 is a block diagram illustrating an ADC constructed according to another embodiment of the present invention that includes sub-range adjustment.

FIG. 8 is a block diagram illustrating an ADC constructed according to another embodiment of the present invention that includes sub-range adjustment. The ADC 800 includes sub-range ADCs 802a, 802b, and, optionally, 802c. Each of the sub-range ADCs 802a, 802b, and 802c samples the communication signal across a respective sub-range of the full range of the analog communication signal. The analog communication signal is operated upon by PGA 806 prior to providing the analog communication signal to each of the sub-range ADCs 802a, 802b, and 802c. The outputs of the sub-range ADCs 802a, 802b, and 802c are received by signal combining circuitry 804 that produces a digital communication signal based upon such outputs.

According to an aspect of the present invention of FIG. 8, the sub-ranges serviced by the plurality of sub-range ADCs 802a, 802b, and 802c are adjusted over time based upon the expected characteristics of the analog communication signal. For example, the range of the analog communication signal may vary over time such that the central range may be adjusted to be wider or narrower. By adjusting the ranges of the sub-range ADCs 802a, 802b, and 802c, the ADC 800 may do a better job of sampling the analog communication signal to produce the digital communication signal.

Figure 9:
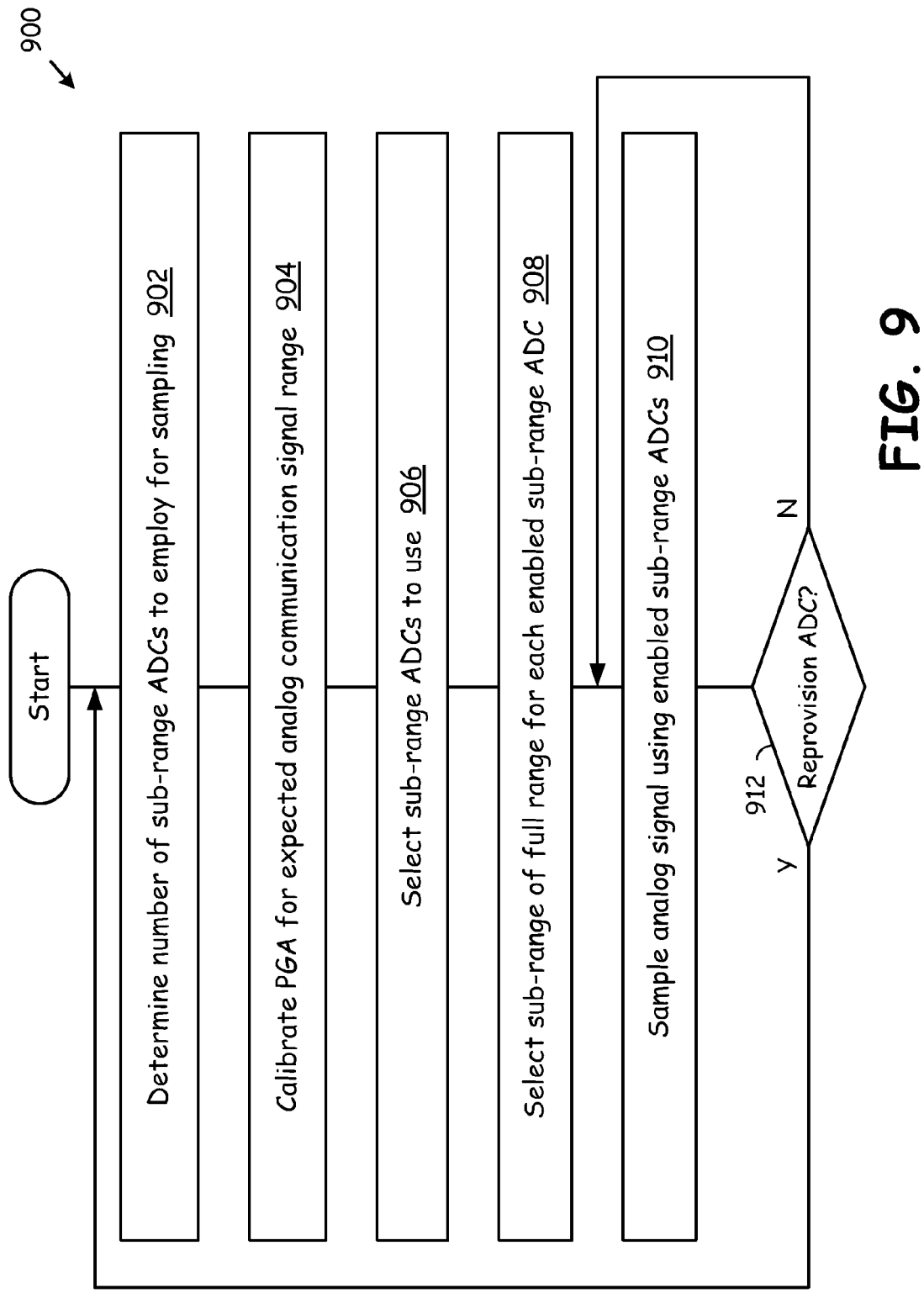
FIG. 9 is a flowchart illustrating operations according to another embodiment of the present invention.

FIG. 9 is a flowchart illustrating operations according to another embodiment of the present invention. Operations 900 commence with the ADC determining a number of sub-range ADCs to employ for sampling (Step 902). Operation 900 continues with calibrating the PGA for expected analog communication signal range (Step 904). The operation then proceeds to selecting the particular sub-range ADCs to be used for signal sampling (Step 906). Then, for each sub-range ADC, a particular signal range to be sampled by each sub-range ADC is selected (Step 908). Then, the ADC samples an analog signal using the enabled sub-range ADCs (Step 910).

Sampling will continue until it is determined to re-provision the sub-range ADCs at Step 912, where reprovisioning will cause operation to return to Step 902.

Figure 10:
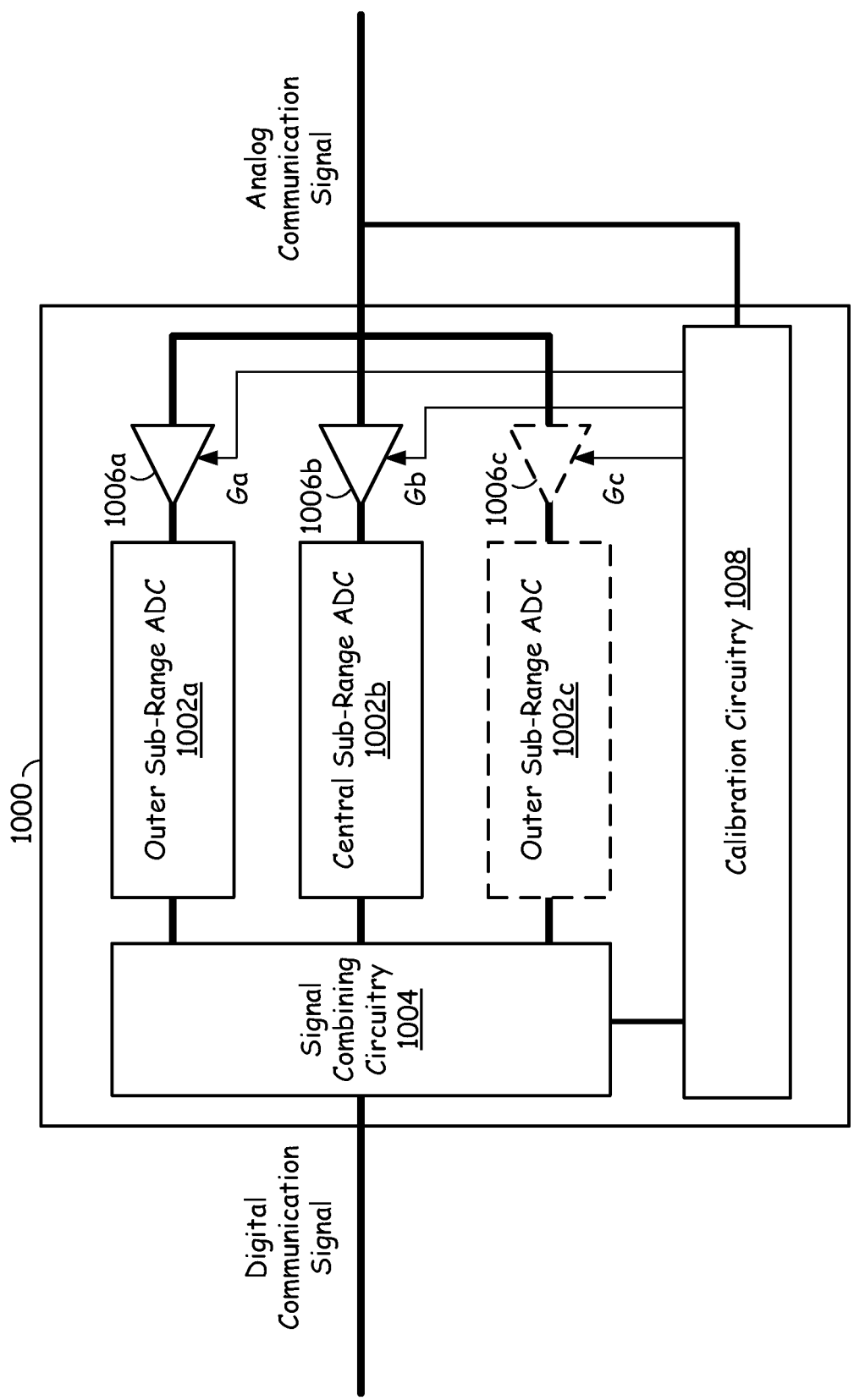
FIG. 10 is a block diagram illustrating an ADC constructed and operated according to one or more embodiments of the present invention.

FIG. 10 is a block diagram illustrating an ADC constructed and operated according to one or more embodiments of the present invention. The ADC 1000 includes a plurality of sub-range ADCs 1002a, 1002b, and, optionally, 1002c. Each of the sub-range ADCs 1002a, 1002b, and 1002c measures an analog communication signal across a respective sub-range of a full range serviced by the ADC 1000. The plurality of sub-ranges extend across the full range with a central sub-range ADC, e.g. ADC 1002b, having a greater quantization step size and, resultantly, quantization accuracy than at least one other sub-range ADC, e.g. sub-range ADC 1002a and sub-range ADC 1002c. The ADC 1000 further includes signal combining circuitry 1004 that is operable to process outputs of the plurality of sub-range ADCs 1002a, 1002b, and 1002c to create a digital communication signal.

The ADC 1000 of FIG. 10 is similar in construct and operation to the ADC 500 of FIG. 5, except that each sub-range ADCs 1002a, 1002b, and 1002c of FIG. 10 each include respective PGAs 1006a, 1006b, and 1006c. Further, the ADC 1000 includes calibration circuitry 1008 operable to calibrate the ADC 100 by providing gain settings to each of the PGAs 1006a, 1006b, and 1006c. The ADC 1000 of FIG. 10 may also include the range adjustment features of the ADC 800 of FIG. 8 in some embodiments. The gain settings Ga, Gb, and Gc provided to sub-range ADCs 1002a, 1002b, and 1002c may include both gain and DC offset components.

Figure 11:
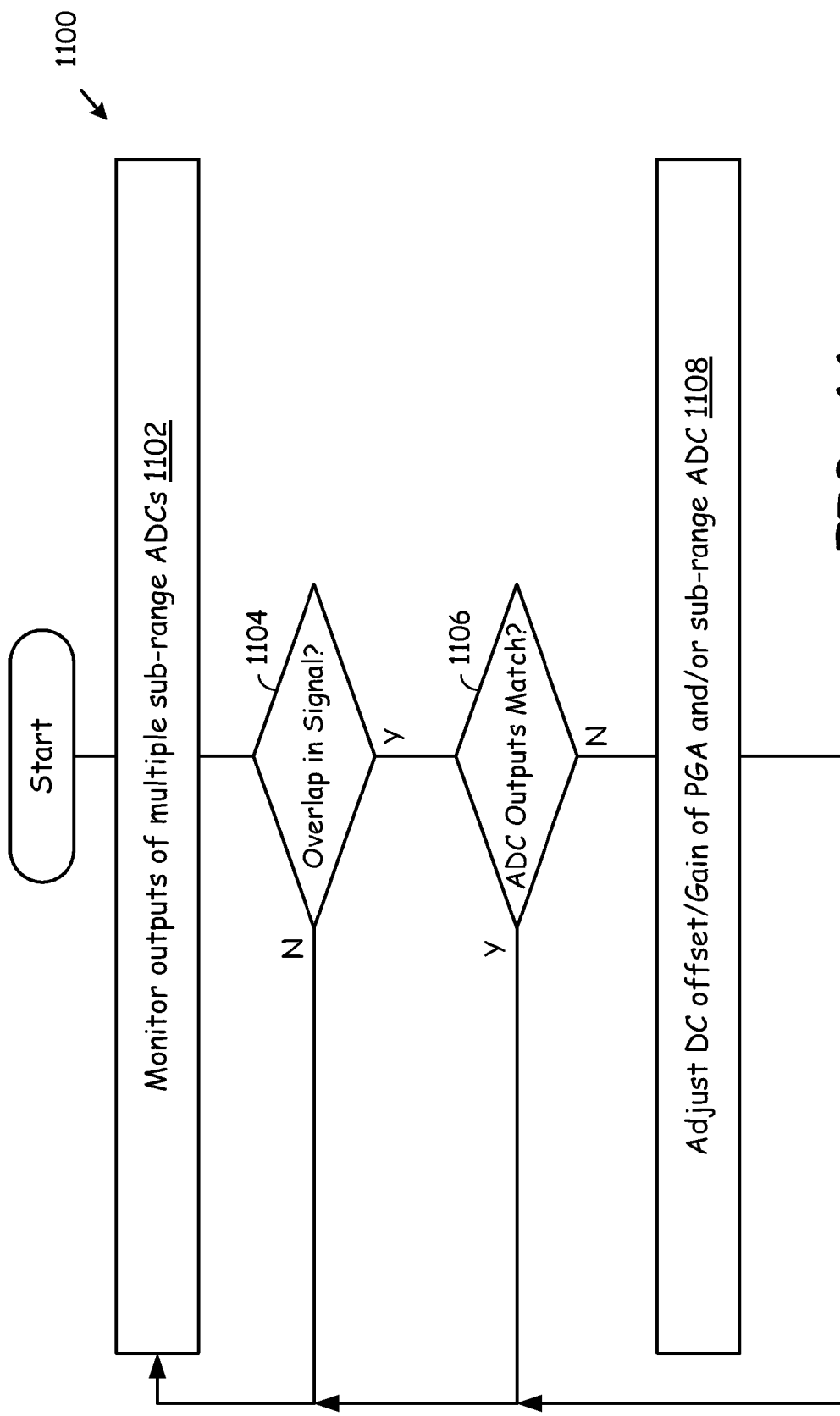
FIG. 11 is a flowchart illustrating operations according to another embodiment of the present invention for ADC calibration.

FIG. 11 is a flowchart illustrating operations according to another embodiment of the present invention for ADC calibration. With the ADC of the present invention, matching the gain and offset of each sub-range ADC exactly to a desired level must be performed to maintain accuracy, i.e., how does the central sub-range ADC sample exactly ¼ of the full range (corresponding to another sub-range ADC in some embodiments), for example. Thus, according to the operations 1100 of FIG. 11, cross-ranging is employed for such calibration operations. Cross-ranging takes advantage of the fact that the analog communication signal may, at any time, be in the range of multiple sub-range ADCs. In such case, the analog communication signal is being quantized by more than one ADC at the same time, e.g., valid digital samples are produced by multiple sub-range ADCs simultaneously. In theory these two results should be identical. If not, it points to gain or offset error in one of the sub-range ADCs. The idea here is that the over-ranging sections of the signal can be used to calibrate the sub-range ADCs while the ADC is fully operating.

Operations 1100 commence with monitoring the outputs of the sub-range ADCs (Step 1102). Upon measuring the outputs of the sub-range ADCs, operations include determining whether the outputs of two of the sub-range ADCs overlap (Step 1102). If the outputs do not overlap, operations return to Step 1102. However, if the outputs of two of the sub-range ADCs overlap as determined at Step 1104 it is next determined whether the outputs of the two sub-range ADCs match (Step 1106). Determining whether the outputs of the two sub-range ADCs match is determined within a selected tolerance. When the two sub-range ADC outputs do not match within the tolerance, the method includes adjusting the gain/DC offset of one or more PGAs of the ADC and/or adjusting one or both of the sub-range ADCs. From Step 1108 operation returns to Step 1102.

The terms "circuit" and "circuitry" as used herein may refer to an independent circuit or to a portion of a multifunctional circuit that performs multiple underlying functions. For example, depending on the embodiment, processing circuitry may be implemented as a single chip processor or as a plurality of processing chips. Likewise, a first circuit and a second circuit may be combined in one embodiment into a single circuit or, in another embodiment, operate independently perhaps in separate chips. The term "chip," as used herein, refers to an integrated circuit. Circuits and circuitry may comprise general or specific purpose hardware, or may comprise such hardware and associated software such as firmware or object code.

The present invention has also been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention.

The present invention has been described above with the aid of functional building blocks illustrating the performance of certain significant functions. The boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention. One of average skill in the art will also recognize that the functional building blocks, and other illustrative blocks, modules and components herein, can be implemented as illustrated or by discrete components, application specific integrated circuits, processors executing appropriate software and the like or any combination thereof.

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "coupled to" and/or "coupling" and/or includes direct coupling between items and/or indirect coupling between items via an intervening item (e.g., an item includes, but is not limited to, a component, an element, a circuit, and/or a module) where, for indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to." As may even further be used herein, the term "operable to" indicates that an item includes one or more of power connections, input(s), output (s), etc., to perform one or more its corresponding functions and may further include inferred coupling to one or more other items. As may still further be used herein, the term "associated with," includes direct and/or indirect coupling of separate items and/or one item being embedded within another item. As may be used herein, the term "compares favorably," indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

The present invention has also been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the invention.

Moreover, although described in detail for purposes of clarity and understanding by way of the aforementioned embodiments, the present invention is not limited to such embodiments. It will be obvious to one of average skill in the art that various changes and modifications may be practiced within the spirit and scope of the invention.

The invention claimed is:

1. A communication device comprising:
   a processing module;
   memory coupled to the processing module;
   a communication interface coupled to the processing module, the communication interface comprising:
      an analog front end that produces an analog communication signal;
      a digital front end that receives a digital communication signal; and
      an Analog to Digital Converter (ADC) that samples the analog communication signal across a full-range, the ADC comprising:
         a plurality of sub-range ADCs, each sub-range ADC measuring the analog communication signal across at least one respective sub-range of the full-range, the plurality of sub-ranges extending across the full-range, a central sub-range ADC having a greater quantization accuracy than at least one other sub-range ADC; and
         signal combining circuitry operable to process outputs of the plurality of sub-range ADCs to create the digital communication signal.

2. The communication device of claim 1, wherein the central sub-range corresponds to an expected range of the analog communication signal.

3. The communication device of claim 1, wherein the central sub-range corresponds to approximately a middle quarter of the full-range.

4. The communication device of claim 1, wherein:
   a first outer sub-range extends from an upper portion of the central sub-range to an upper portion of the full-range; and
   a second outer sub-range extends from a lower portion of the central sub-range to a lower portion of the full-range.

5. The communication device of claim 1, wherein:
   the plurality of sub-range ADCs comprise the central sub-range ADC and an outer sub-range ADC; and
   the outer sub-range ADC corresponds to the upper and lower portions of the full-range.

6. The communication device of claim 5, wherein the central sub-range ADC and the outer sub-range ADC have a common bit size output.

7. The communication device of claim 1, wherein the analog front end further comprises:
   a Programmable Gain Amplifier (PGA) responsive to a gain input and operable to gain adjust the analog communication signal; and
   gain control circuitry operable to produce the gain input so that the analog communication signal is within an expected range.

8. The communication device of claim 1, wherein the communication interface is operable to service Powerline Communications.

9. The communication device of claim 1, wherein the ADC further comprises range adjusting circuitry operable to select the respective sub-ranges serviced by the plurality of sub-range ADCs.

10. A method for operating a communication device comprising:
   producing an analog communication signal by an analog front end;
   sampling the analog communication signal across a full-range by a plurality of sub-range ADCs, each sub-range ADC measuring the analog communication signal across at least one respective sub-range of the full-range, the plurality of sub-ranges extending across the full-range, a central sub-range ADC having a greater quantization accuracy than at least one other sub-range ADC; and
   processing outputs of the plurality of sub-range ADCs to create a digital communication signal.

11. The method of claim 10, wherein the central sub-range corresponds to an expected range of the analog communication signal.

12. The method of claim 10, wherein the central sub-range corresponds to approximately a middle quarter of the full-range.

13. The method of claim 10, wherein:
   a first outer sub-range extends from an upper portion of the central sub-range to an upper portion of the full-range; and
   a second outer sub-range extends from a lower portion of the central sub-range to a lower portion of the full-range.

14. The method of claim 10, wherein:
   the plurality of sub-ranges comprise the central sub-range and an outer sub-range; and
   the outer sub-range corresponds to the upper and lower portions of the full-range.

15. The method of claim 14, wherein the central sub-range ADC and the outer sub-range ADC have a common bit size output.

16. The method of claim 10, further comprising gain adjusting the analog communication signal in an attempt to cause the analog communication signal to be in an expected range.

17. The method of claim 10, wherein the analog communication signal is a Powerline Communication signal.

18. The method of claim 10, further comprising adjusting the respective sub-ranges of the plurality of sub-range ADCs.

19. An Analog to Digital Converter (ADC) that samples an analog signal across a full-range, the ADC comprising:
   a plurality of sub-range ADCs, each sub-range ADC measuring the analog signal across a respective sub-range of the full-range, the plurality of sub-ranges extending across the full-range, a central sub-range ADC having a greater quantization accuracy than at least one other sub-range ADC; and
   signal combining circuitry operable to process outputs of the plurality of sub-range ADCs to create a digital signal.

20. The ADC of claim 19, wherein the central sub-range corresponds to an expected range of the analog signal.

21. The ADC of claim 19, wherein:
a first outer sub-range extends from an upper portion of the central sub-range to an upper portion of the full-range; and
a second outer sub-range extends from a lower portion of the central sub-range to a lower portion of the full-range.

22. The ADC of claim 19, wherein:
the plurality of sub-range ADCs comprise the central sub-range ADC and an outer sub-range ADC; and
the outer sub-range ADC corresponds to the upper and lower portions of the full-range.

23. The ADC of claim 22, wherein the central sub-range ADC and the outer sub-range ADC have a common bit size output.

\* \* \* \* \*